United States Patent
Crafts

[19]

[11] Patent Number: 5,999,440
[45] Date of Patent: Dec. 7, 1999

[54] EMBEDDED DRAM WITH NOISE-PROTECTING SUBSTRATE ISOLATION WELL

[75] Inventor: Harold S. Crafts, Colorado Springs, Colo.

[73] Assignee: LSI Logic Corporation, Milpitas, Calif.

[21] Appl. No.: 09/050,674

[22] Filed: Mar. 30, 1998

[51] Int. Cl.$^6$ .............................. G11C 11/24; G11C 7/00
[52] U.S. Cl. .......................................... 365/149; 365/226
[58] Field of Search ..................... 365/149, 181, 365/189.09, 226, 230.06

[56] References Cited

U.S. PATENT DOCUMENTS

| | | | |
|---|---|---|---|
| 4,866,676 | 9/1989 | Crisp et al. | 365/200 |
| 5,106,773 | 4/1992 | Chen et al. | 438/131 |
| 5,208,778 | 5/1993 | Kumanoya et al. | 365/201 |
| 5,231,319 | 7/1993 | Crafts et al. | 327/277 |
| 5,270,977 | 12/1993 | Iwamoto et al. | 365/201 |
| 5,323,348 | 6/1994 | Mori et al. | 365/200 |
| 5,325,334 | 6/1994 | Roh et al. | 365/201 |
| 5,373,472 | 12/1994 | Ohsawa | 365/201 |
| 5,375,095 | 12/1994 | Yamada et al. | 365/226 |
| 5,386,386 | 1/1995 | Ogihara | 365/200 |
| 5,388,104 | 2/1995 | Shirotori | 371/21.1 |
| 5,440,517 | 8/1995 | Morgan et al. | 365/201 |
| 5,471,482 | 11/1995 | Byers et al. | 371/21.2 |
| 5,502,675 | 3/1996 | Kohno et al. | 365/200 |
| 5,517,450 | 5/1996 | Ohsawa et al. | 365/200 |
| 5,577,004 | 11/1996 | Leshem | 365/230.03 |
| 5,623,640 | 4/1997 | Nakabo | 365/200 |
| 5,650,975 | 7/1997 | Hamade et al. | 365/230.06 |
| 5,668,755 | 9/1997 | Hidaka | 365/181 |
| 5,689,466 | 11/1997 | Quereshi | 365/201 |
| 5,694,355 | 12/1997 | Skjaveland et al. | 365/226 |
| 5,825,682 | 10/1998 | Fukui | 365/200 |

*Primary Examiner*—Trong Phan

[57] ABSTRACT

The plurality of memory cells of a dynamic random access memory (DRAM) are formed in a well of one majority carrier type, and the well is located in a substrate of the other majority carrier type. The well electrically isolates the memory cells from electrical noise signals created by current in the substrate and charged carriers created by alpha particles. The well is connected at multiple spaced-apart locations to a referencing conductor, to maintain the well at a uniform potential in response to noise. The memory cells are formed in a single well, or groups of the memory cells are each formed in a separate well. A shielding conductor, such as the mesh or an integrally continuous layer of metal which is spaced from the memory cells, overlays a matrix of the memory cells and shields then from the effects of noise.

21 Claims, 7 Drawing Sheets

EMBEDDED DRAM WITH NOISE-PROTECTING SUBSTRATE ISOLATION WELL

This invention generally relates to dynamic random access memory (DRAM) which is embedded in a silicon chip as part of an integrated circuit (IC), such as an application specific integrated circuit (ASIC), a mixed signal ASIC or a system level integrated circuit (SLIC). More particularly, the present invention relates to new and improved embedded DRAM with built-in protection against the adverse influence of spurious electrical signals or "noise." The built-in noise protection enhances the ability of the DRAM to supply correct data when the DRAM is embedded in a SLIC which has noisy integrated circuit elements, when the SLIC with the embedded DRAM is used with external noisy elements, or when the SLIC is subject to occasional influences from radioactive alpha particles and the like, among other things.

CROSS REFERENCE TO RELATED INVENTIONS

This invention is related to the following inventions which are described in U.S. patent applications filed concurrently therewith: "DRAM with Built-In Noise Protection," Ser. No. 09/052,274 (Docket No. 98-037); "Embedded DRAM with Noise-Protected Differential Capacitor Memory Cells," Ser. No. 09/052,279 (Docket No. 98-097); and "Embedded DRAM with Noise Protecting Shielding Conductor," Ser. No. 09/052,273 (Docket No. 98-098). The disclosures of these concurrently filed applications are incorporated in this application by this reference.

BACKGROUND OF THE INVENTION

A DRAM is a memory element which holds and supplies information for use by electronic digital computing and logic elements, such as microcontrollers, microprocessors, logic arrays, and the like. An ASIC or an SLIC is a single IC which includes a combination of various electronic components, such as microcontrollers, microprocessors, logic gates, registers, amplifiers, linear circuit elements and the like, all of which have been selected, connected and integrated together to perform specific functions for a specific application. Examples of SLICs are controllers for computer memory disc drives, graphics controllers, LAN switches, fuel injector control systems for internal combustion engines, global positioning systems, and control devices for a wide variety of consumer products, among many others. SLICs are desirable for use in mass-produced products because of the enormous amount of functionality which can be obtained at a very low effective cost. These types of SLICs are sometimes referred to as a "system on a chip," because of the complete functionality obtained from the single chip or IC.

DRAMs have only recently been "embedded" or incorporated as part of SLICs. Previously, when the SLIC required memory to function, separate memories or DRAM chips were provided on a printed circuit board. Embedding DRAM in a SLIC chip avoids the additional cost of a separate memory chip. Avoiding the cost of the separate DRAM chip is attractive when the SLIC itself requires only a small amount of memory, because separate DRAM chips are relatively costly and of considerable memory size. Even when more substantial amounts of memory are required, the incorporation of the memory in the single SLIC chip will frequently be less expensive than purchasing a separate DRAM chip.

The typical DRAM is formed by thousands of individual memory cells arranged in a matrix-like configuration and formed into a substrate of the SLIC. Each DRAM cell includes a capacitor which is electrically charged or discharged in a "write" operation. The charge establishes a voltage on the capacitor, and the level of the voltage represents a data bit. The data bit represented by the capacitor charge is determined by comparing the capacitor voltage to a threshold reference. The voltage levels which must be sensed to establish the data bit level of the cell in a DRAM are relatively small, e.g. 50–100 millivolts, and differences in signals of less than 50 millivolts may mean the difference between an accurate or an inadequate data bit determination.

The memory cells of the DRAM matrix are addressed by signals supplied on word lines and bit lines. The word lines extend in a horizontal reference direction in the matrix and connect to the memory cells in the horizontal rows and thus intersect vertical columns of memory cells in the matrix. The bit lines extend in a vertical reference direction in the matrix and connect to the memory cells in vertical columns and thus intersect horizontal rows of cells. By energizing a selected word line, the voltage from the memory cells in the horizontal row corresponding to the selected word line are presented on the bit lines extending from each of the cells.

The DRAM memory array is usually divided into one or more segments, and each of the segments is further divided into bit blocks. Each bit block has a plurality of memory cells, and those memory cells are organized into rows and columns in a matrix. Individual words are selected by addressing the DRAM segments, selecting individual columns in the bit blocks, and selecting the desired word line.

One disadvantage associated with embedding the DRAM in the SLIC is that the noise from the other logic components of the SLIC may cause the performance of the DRAM to decline. The other logic and integrated circuit components continuously switch between conductive and nonconductive states and cause current to begin and end flowing within these circuit components, the conductors throughout the SLIC, the substrate of the SLIC, lead bonds connecting the SLIC chip to external components, and external components themselves. Generally, when current flow stops quickly, the electrical inductance of the associated circuit elements causes a voltage spike or pulse to ripple through the circuit components on the SLIC substrate. The voltage pulse may be sufficient to cause the voltage on the substrate to fluctuate or "bounce." Voltage bounces may reach as high as 1 volt and may be of enough magnitude to corrupt the bit line signals and data stored in some of the memory cells. Furthermore, once the memory cell capacitors discharge onto the bit lines, the typical voltages on bit lines are much smaller than the voltages present on the memory cell capacitors because of the larger capacitance of the bit lines compared to the memory cell capacitors. Typical bit line voltages are in the range of tens or hundreds of millivolts while typical memory cell capacitor voltages are in the range of 1 to 3 volts. With such low bit line voltages, a substrate which is subject to relatively large voltage bounces often makes it impossible or difficult to sense the bit line voltages accurately.

Noise influences on the DRAM can also originate because of a connection between the SLIC and the electronic devices external to the SLIC on the printed circuit board, particularly when the external devices draw a large amount of current. Current transients conducted through the lead bonds and other conductors may create voltage pulses, because of the inductance of the current conducting elements. For example, an external data bus is typically connected to the SLIC over which to read data bit signals. A read process may draw a large amount of current in very short amount of time. The resulting current surge creates a voltage pulse, and that voltage pulse may adversely impact the performance of the DRAM.

To avoid noise problems, several approaches have been explored. One approach involves attempting to determine when the noise will occur and then reading the DRAM only during quiet times. Since most of the operations in simple systems are controlled by clock pulses, it is possible to predict when some functional operations will take place and generate noise. However, this approach is impractical in most complex SLICs because multiple clocks are used to control the different components of the SLIC. Determining when the noise will occur on a consistent basis requires that the multiple clocks be synchronized, which is difficult, impossible or impractical. Further, given the many operations that the SLIC performs on a continuous basis, quiet times may not exist for long enough periods of time to enable satisfactory DRAM operation.

Another approach to avoiding noise problems is to attempt to find a location on the SLIC substrate for the DRAM which is substantially free from noise. However, noise-immune locations are non-existant in many SLICs. The location of the DRAM portion of the SLIC varies from one SLIC chip to the next, because each SLIC chip is generally different from others in configuration and in lay-out. Each SLIC is for a different specific application and uses different elements to accomplish that different function. Thus, a quiet location on one SLIC chip may not be a quiet location on another SLIC chip.

Another approach to reducing the impact of noise on the DRAM has been to use biasing techniques. Since the voltage of each memory cell must be compared to a threshold voltage to determine whether the data bit is high or low, by adjusting or biasing the threshold voltage, some noise-induced variance in the sensed voltages can be accommodated. However, the noise from large voltage bounces on the substrate may be so large in comparison to the bit line voltages that biasing cannot avoid the noise. Often, the entire substrate is biased to reduce the effect of noise caused by the voltage bounces. The substrate is typically connected to the negative power supply. By making the substrate more negative in voltage, the voltage fluctuations may have a reduced effect on the data signals stored in the memory. Substrate voltage bounces usually result in an uneven voltage distribution and differential across the substrate. The uneven distribution affects the signals on the bit lines to differing degrees depending upon the location of the bit lines relative to the location of the voltage differential in the substrate. Under such circumstances, biasing the entire substrate does not compensate for the differential. For these and other reasons, the unique noise environment of each SLIC, the differing physical locations of the DRAM on the SLIC chip, and the differing external components to which the SLIC chip may be connected, generally combine to make biasing techniques ineffective in solving noise problems.

Another cause of data corruption in a DRAM is alpha particles. Alpha particles are high energy cosmic rays which are naturally present to a small degree in the environment. The alpha particles occasionally pass through the substrate of the SLIC and generate a small cloud or wake of positive and negative charge carriers (holes and electrons, respectively). Some of these charged carriers may combine with the charges in the memory cell capacitor and discharge the capacitor, thereby corrupting the data stored in the cell. This condition creates a so-called "soft error," since the cell has not been permanently damaged but has only lost its stored data due to the influence of the alpha particles.

It is with respect to these and other considerations relating to noise in DRAM embedded in SLICs that the present invention has evolved.

SUMMARY OF THE INVENTION

One improvement of this invention relates to constructing an embedded DRAM in an SLIC which obtains a relatively high level of noise immunity and protection from a variety of different noise sources. Another improvement relates to enhancing the immunity of an embedded DRAM to noise created by substrate voltage bounces, voltage differentials across the substrate, external switched current-flow influences and transients, and the operation of other electrical elements in the SLIC, all of which is achieved substantially without regard to the location of the embedded DRAM in the substrate of the SLIC. A further improvement relates to enhancing the immunity of an embedded DRAM to noise and signal degradation that is caused by alpha particles. A further improvement is to obtain these and other improvements while embedding the DRAM in a SLIC that must be fabricated principally using a semiconductor logic fabrication process, rather than in the context of a DRAM fabrication process which has been refined solely for that purpose.

These and other improvements are obtained in a dynamic random access memory (DRAM) segment which comprises a plurality of memory cells formed in a well of one majority carrier type which is formed in a substrate of the other majority carrier type. The improvements relate to a well which electrically isolates each memory cell from electrical noise signals created by current and current transits conducted in the substrate. The well also assists in dissipating the charged carriers created by alpha particles.

The following additional preferable aspects of the invention also improve the noise immunity of the memory cell. The well is connected to a quiet, substantially isolated, power supply external to the DRAM segment to reference the memory cells contained in the well to a stable potential. The well is connected at a plurality of spaced-apart locations throughout the well to a conductor, which may be formed by a plurality of connected intersecting conductors formed as a mesh, to maintain the well at a uniform potential in response to noise. Each memory cell includes a capacitor having a reference potential plate, and a capacitor reference potential conductor is connected to all of the reference potential plates of the memory cell capacitors, to maintain the reference potential for the memory capacitors and allow them to charge and discharge more uniformly under the influence of noise. The capacitor reference potential conductor is also connected to a quiet external supply reference, to further maintain the uniformity of potential on the well. The memory cell employs a logically complementary pair of charge storage capacitors, and differential sensing is used to avoid the influence of noise on a single memory capacitor. The memory cells are formed in a single well, or groups of the memory cells are each formed in a separate well. A shielding conductor, such as the mesh or an integrally continuous layer of metal which is spaced from the memory cells, overlays a matrix of the memory cells and shields then from the effects of noise. The noise shielding improvements of the present invention are particularly beneficial when the matrix of memory cells is embedded in a system level integrated circuit (SLIC), and some of the conductors of multiple layers of interconnects of the SLIC, such as data and address bus conductors and power conductors, are positioned on an opposite side of the shielding conductor from the memory cells.

A more complete appreciation of the present invention A and its scope can be obtained by reference to the accompanying drawings, which are briefly summarized below, to the following detailed description of presently preferred embodiments of the invention, and to the appended claims.

DETAILED DESCRIPTION

Figure 1:
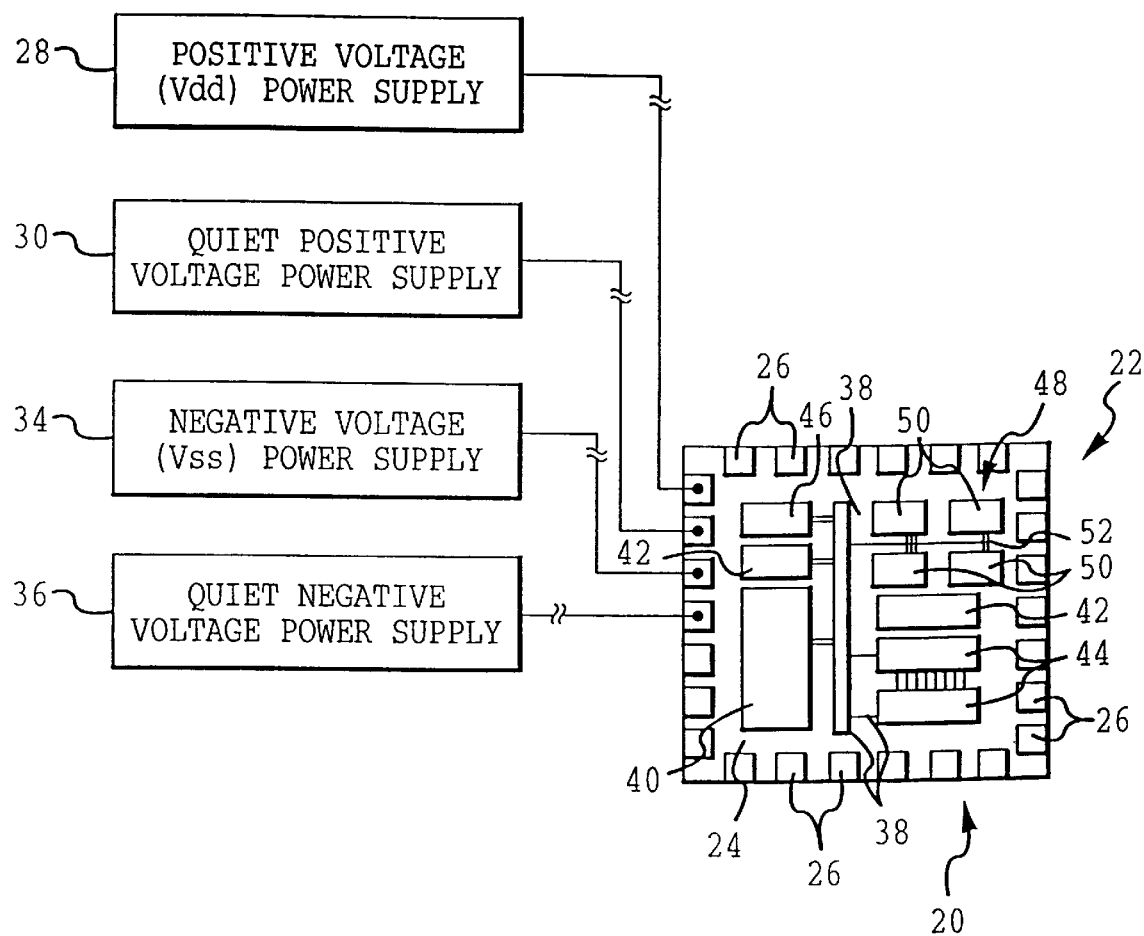
FIG. 1 is an overall layout illustration, not necessarily to scale or in proportion, illustrating a typical SLIC with an embedded DRAM which incorporates the present invention, and a block diagram of certain external components used with the SLIC.

A system level integrated circuit (SLIC) 20 which incorporates the present invention is generally shown in illustrative, not-to-scale and not-to-proportion form in FIG. 1. Other than incorporating the present invention, the SLIC 20 is conventional. The SLIC 20 is formed as an integral unit on a silicon die or chip 22. The silicon chip 22 comprises a P-type substrate 24 in and on which the functional components of the SLIC are formed. Pads 26 are formed on the exterior of the chip 22 by which to connect, through lead bonds to package pins, external electrical conductors including a positive voltage (Vdd) power supply 28, a "quiet" positive voltage power supply 30, a negative voltage (Vss) power supply 34 and quiet negative voltage power supply 36. The pads 26 are connected by conductors (not specifically shown) to the various functional components of the SLIC 20. The functional components of the SLIC are interconnected by conductors 38, generally in the form of conventional buses and bus conductors. The functional components will vary according to the SLIC, but in general those components will include a processor 40, a read only memory (ROM) 42, logic arrays 44, and registers 46, for example, as well as other well known digital or analog components.

Embedded in the substrate 24 of the SLIC 20 is a dynamic random access memory (DRAM) array 48. The embedded DRAM array 48 is preferably formed by a plurality of separate DRAM segments 50 (four are shown in FIG. 1). The DRAM segments 50 are interconnected by the electrical conductors 52 within the DRAM array. The DRAM array 48 is interconnected with other components of the SLIC 20 in the conventional manner by a bus formed by the conductors 38. The bus conductors 38 also connect to many of the other components of the SLIC, including the processor 40 and various other components 42, 44, and 46, etc. In general, the numbers, types and layouts or positions of the specific SLIC components on the chip 22 will vary according to the application of each different SLIC.

Figure 2:
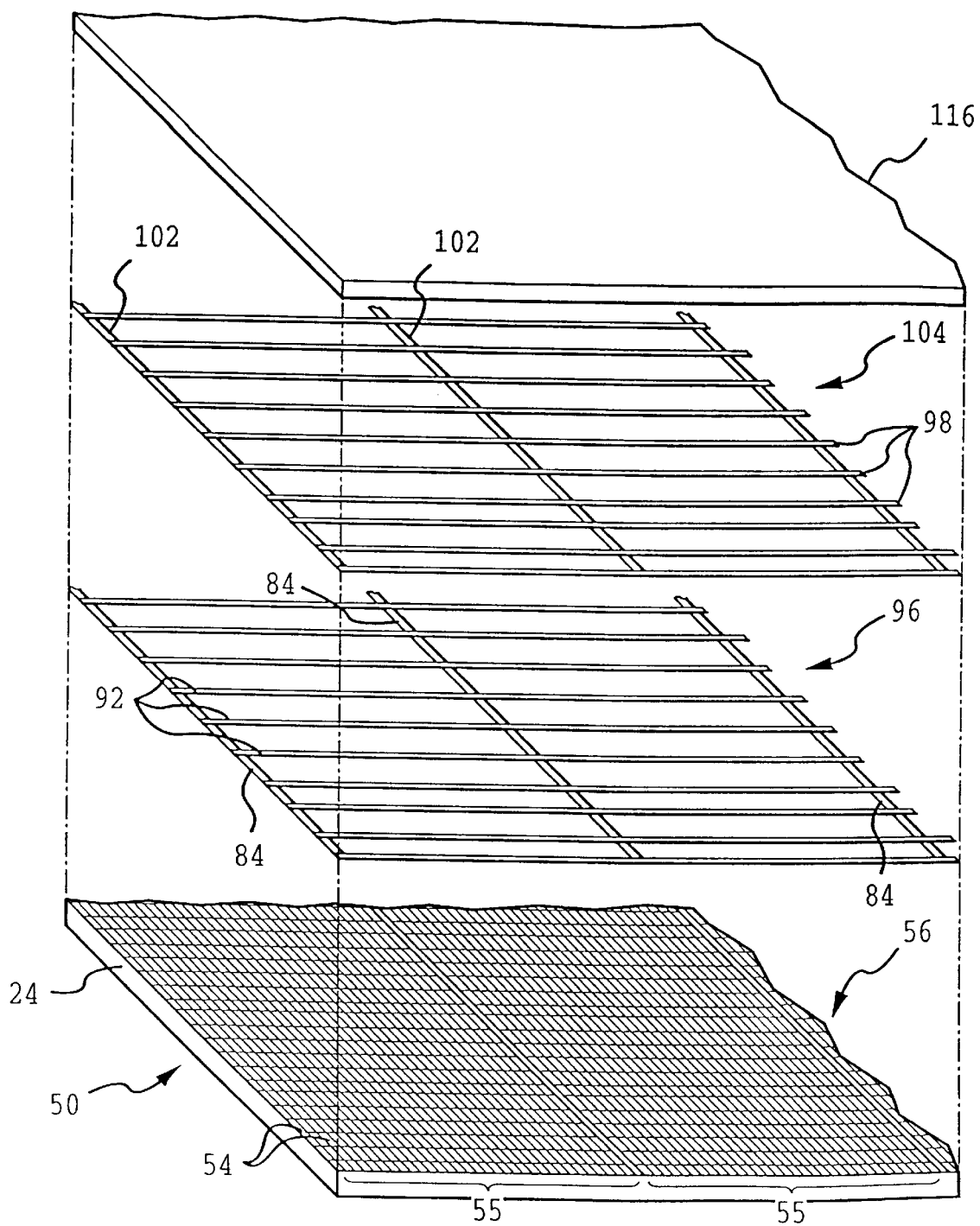
FIG. 2 is an exploded, partial, perspective view of certain portions of the embedded DRAM shown in FIG. 1, with some of the individual portions shown in different proportions to other individual portions for illustrative purposes.

Each DRAM segment 50 is formed by a plurality of memory cells 54 formed into the substrate 24 in a matrix-like configuration 56, as shown in FIG. 2. Each memory cell 54 is generally a replication of the other memory cells, although the configuration of some of the memory cells 54 may be slightly different from the other memory cells 54 to allow the entire segment 50 of cells 54 to be organized in a space-efficient manner into the matrix 56. The memory cells 54 in the matrix 56 are aligned in horizontal rows and vertical columns.

The memory cells of each DRAM segment 50 are divided into bit blocks, two of which are shown at 55 in FIG. 2. Each bit block 55 is formed by a predetermined number of columns of memory cells 54. The number of rows and columns of memory cells in each bit block varies, but as an example, 256 rows and 32 columns would be considered useful. Thus, each bit block in this example would contain 8K of data bits. Reading or writing is accomplished by energizing the selected word line, selecting the desired column of the bit block, and reading or writing the data bits from the intersecting addressed row and selected column.

Figure 3:
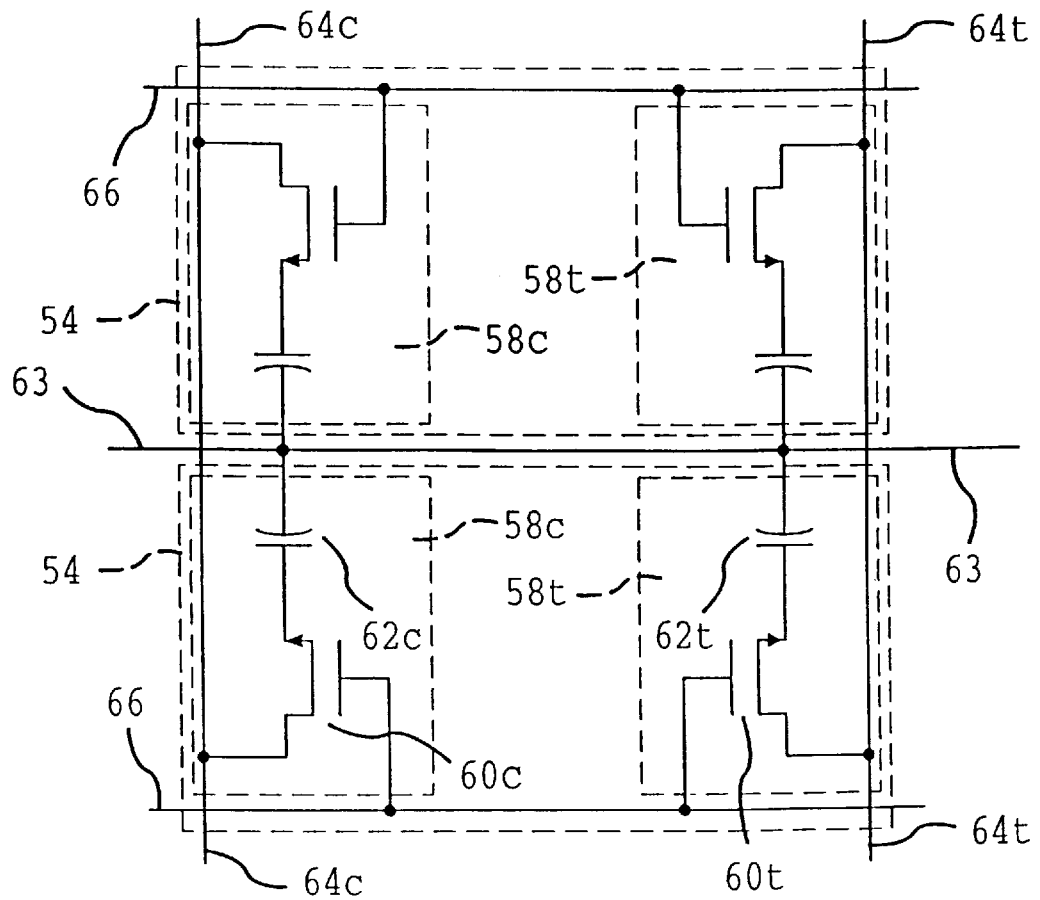
FIG. 3 is a schematic diagram of two memory cells of the embedded DRAM shown in FIG. 2.
Figure 5:
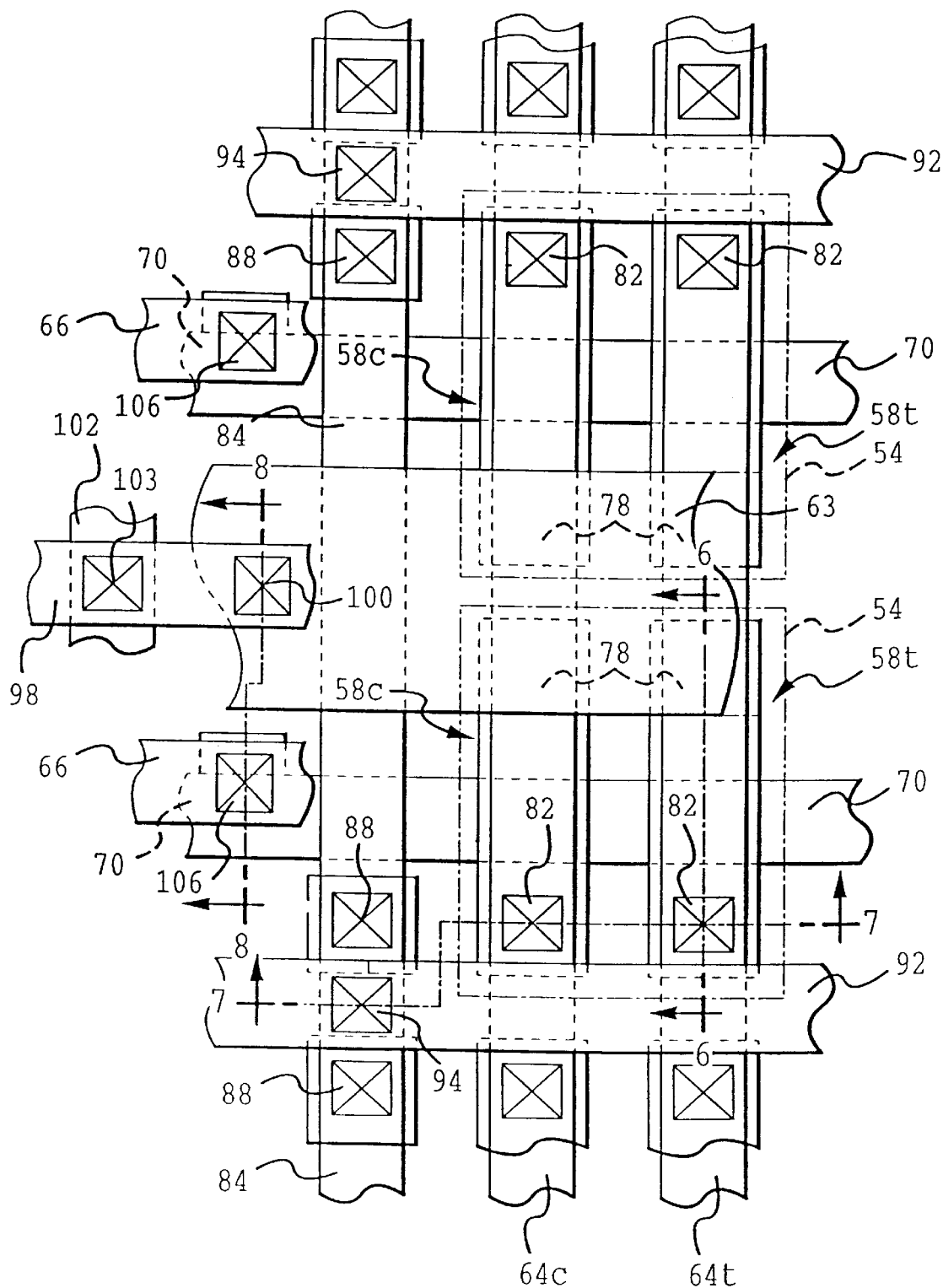
FIG. 5 is a top view of two memory cells of the embedded DRAM shown in FIG. 2, structurally corresponding to the schematic diagram elements shown in FIG. 3.

Each DRAM memory cell 54 is preferably formed by two field effect transistor (FET)-capacitor combinations 58t and 58c, as shown in FIGS. 3 and 5. Using the two transistor-capacitor combinations 58t and 58c as each memory cell 54 allows differential sensing of the bit line voltages, which is advantageous in avoiding the influences of noise. The two transistor-capacitor combinations function as logical complements of one another and thus are designated as true ("t") and complement ("c") with respect to one another, as are many of the other elements associated with the DRAM cells 54 described herein. However, if differential sensing is not desired, the other improved aspects of the present invention may be practiced by using only a single transistor-capacitor combination as each DRAM cell 54, which is the conventional practice in DRAMs.

From an electrical circuit standpoint as shown in FIG. 3, each transistor-capacitor combination 58t and 58c comprises a P-channel transistor 60t and 60c connected in series with a capacitor 62t and 62c, respectively. One plate of each capacitor 62t and 62c is connected to a capacitor reference potential conductor 63 which extends in the horizontal reference direction across the substrate 24, as shown in FIG. 2. As is shown schematically from an electrical standpoint in FIG. 3, and as will be discussed from a structural standpoint in connection with FIG. 5, the horizontally extending capacitor reference potential conductor 63 overlaps two vertically adjoining memory cells 54 in each vertical column. From a structural standpoint, the capacitor reference potential conductor 63 is sufficiently wide to function as a reference potential plate of the capacitors 62t and 62c of the vertically adjoining pair of memory cells 54. The capacitor reference potential conductor 63 extends between adjoining horizontal rows of memory cells 54 in all of the bit blocks of the DRAM segment and is connected to the external quiet negative voltage power supply 34 (FIG. 1), in the preferred embodiment described herein. In other implementations of the DRAM, the capacitor reference potential conductor 63 may be connected to other potential or reference sources.

A drain terminal of transistor 60t is connected to one bit line 64t, and the drain terminal of transistor 60c is connected to the other bit line 64c. As shown in FIG. 2, the bit lines 64t and 64c extend vertically within the matrix 56. Each complementary set of bit lines 64t and 64c connect to all of the transistors 60t and 60c, respectively, in each individual vertical column of cells 54. Thus, each separate column of cells 54 has its own unique set of complementary bit lines 64t and 64c.

Gates of each transistor 60t and 60c are connected commonly to a single word line 66, as shown in FIG. 3. Referring to FIG. 2, each word line 66 extends horizontally across the matrix 56. Each word line connects to all of the gates of the transistors 60t and 60c of all of the memory cells 54 in each horizontal row of memory cells in the matrix 56. Thus each horizontal row of memory cells 54 has its own unique word line 66.

The DRAM memory cells 54 store the "bits" of data. A data bit is the basic element of data recognized by logic elements and is either "high" or "low," usually stated to be either a "1" or a "0," respectively. The 1's and 0's are combined to form a binary word or code representing useful data. The capacitors 62t and 62c store charge to represent the data bits. Because the capacitors 62t and 62c are complementary in each memory cell 54, the charge is stored on one capacitor while the other capacitor is discharged. The voltage from each capacitor is related to its stored charge.

The transistors 60t and 60c either connect or disconnect the capacitors 62t and 62c to the bit lines 64t and 64c, respectively. The bit lines are connected to sense amplifiers and write amplifiers which are located at the vertical terminal ends of the bit lines extending across the memory matrix 56 (FIG. 2). When the capacitors 62t and 62c are connected to the sense amplifier, the voltages on the bit lines 64t and 64c which have been created by the charges on the capacitors are sensed to "read" the data bit held by the memory cell 54. The memory cell capacitors are charged and discharged by conducting current from the write amplifier along the bit lines and through the transistors 60t and 60c to charge or discharge the capacitors 62t and 62c to "write" data to the memory cell.

To access each cell 54 of a horizontal row in the bit block for reading or writing, the word line 66 is energized with a voltage. The voltage from the word line 66 causes the transistors 60t and 60c of all of the memory cells 54 of the horizontal row of the matrix. With the transistors 60t and 60c in a conductive state, the read and write operations may then proceed as to those memory cells in the horizontal row.

During a read operation, the voltages existing on the capacitors 62t and 62c are placed on the bit lines 64t and 64c, because the transistors 60t and 60c are in a conductive state. Because the bit lines are considerably larger in physical size than the plates of the memory capacitors, the voltage appearing on the bit lines is considerably less than the voltage on the memory cell capacitors before they were connected to the bit lines. This factor makes sensing the bit line voltages more difficult, because a memory cell voltage in the range of volts appears on the bit lines as a voltage in the range of tens of millivolts.

Figure 4:
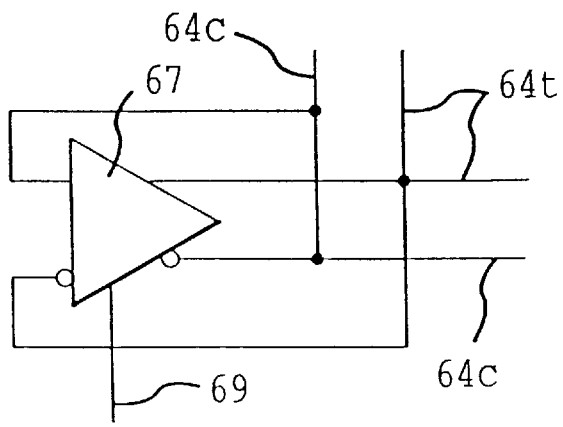
FIG. 4 is a diagram of a cross-coupled sense amplifier connected to bit lines extending from the memory cell shown in FIG. 3.

After the memory cell capacitor voltages have been applied to the bit lines 64t and 64c, a differential sense amplifier 67 is enabled by a signal supplied at 69, as shown in FIG. 4. The sense amplifier 67 is formed by a cross-coupled inverter, as shown. The voltage from the capacitors 62t and 62c (FIG. 3) is initially applied to the input terminals of the cross-coupled inverter. In response to this initial small signal differential, the cross-coupled inverter amplifies that difference until the signals on the bit lines 64t and 64c are respectively much greater, to approximately the maximum differential available from the cross-coupled inverter. Thus, the cross-coupled inverter sense amplifier 67 amplifies the initial small differential in bit line signal levels to signal levels of much greater differential, and these amplified signals are thereafter applied to other logic elements of the DRAM, such as a latch (not shown).

By use of the two capacitors 62t and 62c and the two bit lines 64t and 64c for each memory cell 54 and the use of differential bit line sensing, greater noise immunity is obtained, compared to the typical previous DRAM configuration of a single capacitor and bit line per memory cell. With a single capacitor and bit line per memory cell, the data level of the cell is determined by comparing the voltage level on the bit line to a threshold voltage level. Influences from noise may alter the bit line voltage level relative to the threshold level and thereby corrupt the accurate determination of the data bit signal level from the memory cell. With the differential sensing, noise will affect the signal levels on both of the bit lines 64t and 64c approximately equally, and the differential voltage level sensed by the sense amplifier 67 will not be altered by the noise. Consequently, noise will not corrupt the determination of the data level of the memory cell.

Figure 6:
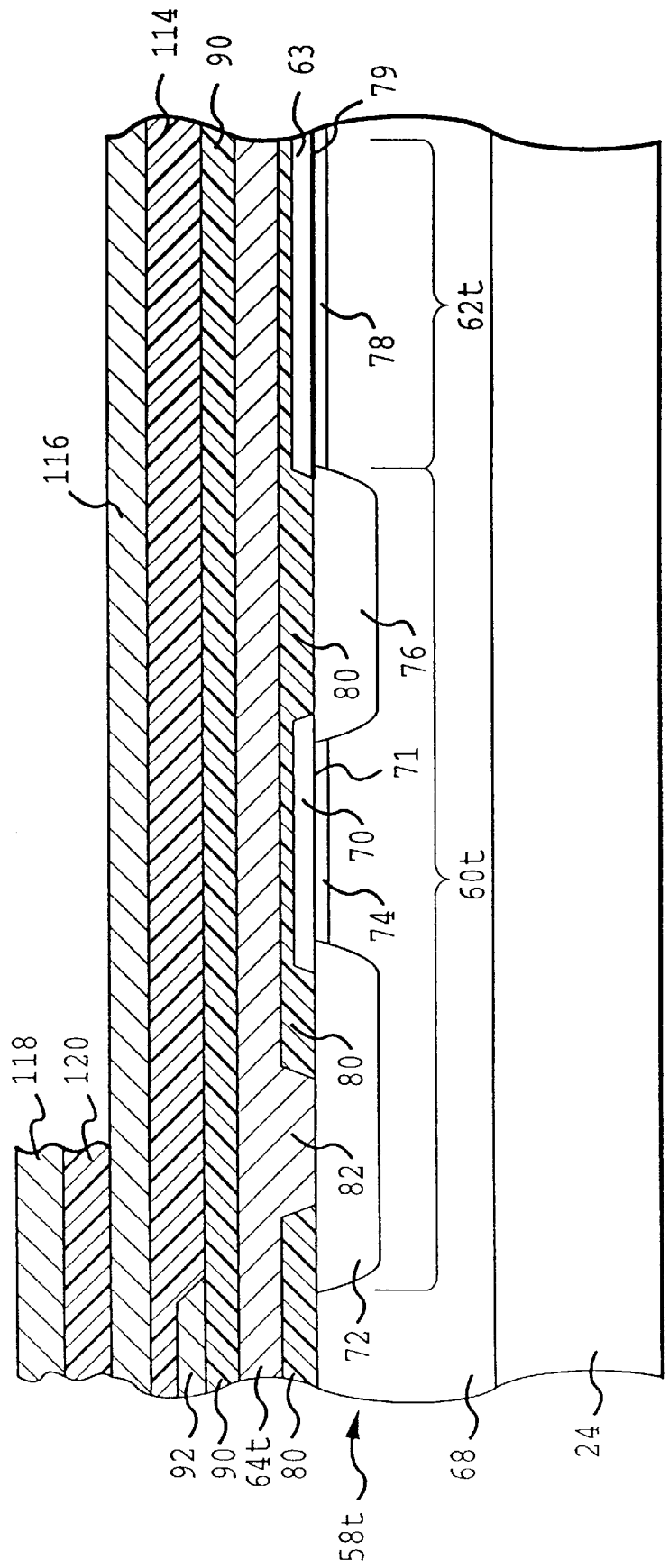
FIG. 6 is an enlarged cross sectional view taken substantially in the plane of line 6—6 in FIG. 5.
Figure 7:
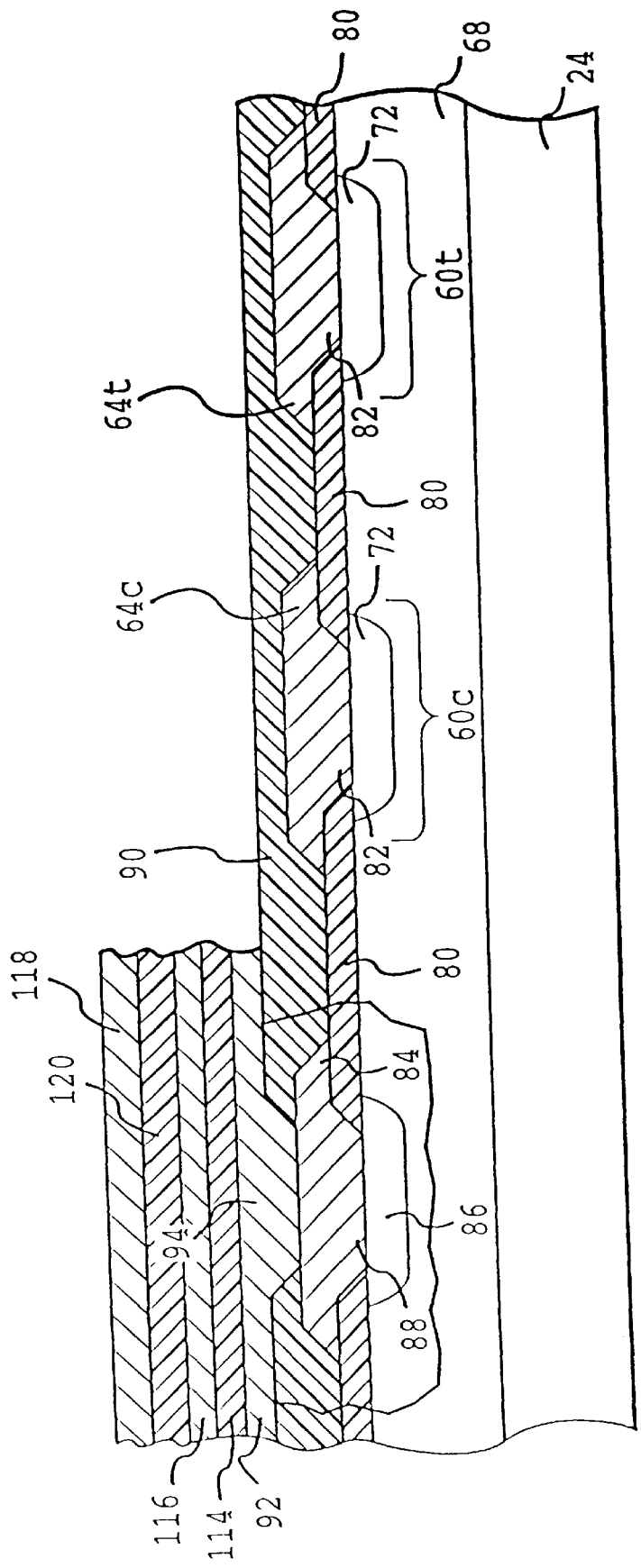
FIG. 7 is an enlarged cross sectional view taken substantially in the plane of line 7—7 in FIG. 5, with a portion broken out for clarity.

The structural features of the memory cells 54 are shown in FIGS. 5–7. Each transistor-capacitor combination 58t and 58c is formed generally in a rectangular orientation extending vertically as shown in FIG. 5. The bit lines 64t and 64c extend over the top of the transistor-capacitor combinations 58t and 58c, respectively. Gate conductors 70, which connect to the word lines 66, extend tranversely across the plurality of the transistor-capacitor combinations 58t and 58c which form all of the memory cells in a row of the bit block. The capacitor reference potential conductor 63 overlays the adjoining portions of the transistor-capacitor combinations 58t and 58c of two vertically adjoining cells 54 in two horizontal rows of cells. The bit lines 64t and 64c and the gate conductors 70 connect to the elements of each memory cell 54 in the manner shown and described in conjuntion with FIGS. 6 and 7.

Each transistor-capacitor combination 58t and 58c is formed in an N-well 68 in the substrate 24, as is represented by the transistor-capacitor combination 58t as shown in FIG. 6. The N-well 68 is created in a conventional manner in the substrate 24, preferably by ion implantation and diffusion. The N species is first implanted to a predetermined depth within the area of the P-type substrate 24. Then the implanted N species is diffused by thermal processes to spread it and create the N-well to a predetermined depth. The N-well 68 is preferably large enough (in terms of depth, length and width) to accommodate all of the memory cells 54 of all of the the DRAM segments 50. However, more than one N-well 68 may be required to accommodate all of the cells 54 of the DRAM segment 50.

The P-channel transistor 60t is constructed conventionally by implanting or diffusing P-type material in the N-well 68 to form P-type drain and source regions 72 and 76, respectively. A channel region 74 will exist between the source and drain regions 72 and 76. A P-type channel region 78 is formed extending from the source region 76. The channel region 78 forms a charge plate of the capacitor 62t which is connected to the transistor 60t (FIG. 3). The portion of the capacitor reference potential conductor 63 which overlays the P-type channel region 78 forms the other reference potential plate of the capacitor 62t, as shown in FIG. 6.

Between the capacitor plate P-type channel region 78 and the overlaying conductor 63, a very thin layer of nonconductive oxide 79 (FIG. 6) forms the dielectric material for the capacitor 62t. The oxide layer 79, which is preferably silicon dioxide, is grown on the top surface of the channel region 78 after it is formed and before the capacitor reference potential conductor 63 is formed.

The oxide layer 79 of capacitor dielectric material is formed simultaneously with the gate oxide material 71 of the transistor deposited between the area 74 and the gate conductor 70. Using the oxide layer 79 as the capacitor dielectric material allows the standard logic fabrication process to be employed to fabricate the embedded DRAM. No special processes are required to form the memory capacitors, as is the case when DRAM ICs are manufactured as separate chips. Using the DRAM processes to fabricate the SLIC would be very difficult to accomplish on a cost-effective basis, because the majority of the SLIC constitutes logic components, or components more equivalent to logic components than to specialized DRAM structures. Consequently, the standard logic fabrication process, which already requires the use of the oxide 79 to form the gates of the transistors, allows the memory capacitors to be fabricated simultaneously in the SLIC without adding complexity to the standard logic fabrication process. The DRAM memory capacitors are effectively embedded in the SLIC as a result.

The gate conductor 70 (FIGS. 3 and 5) is formed horizontally above the channel region 74 to create a gate of the transistor 60t. The gate conductor 70 and the capacitor reference potential conductor 63 are preferably both formed simultaneously and of polysilicon. A layer 80 of insulating material is thereafter applied to cover the gate conductor 70 and the capacitor reference potential conductor 63, among other things.

The capacitor 62t is charged when positive carriers (holes) are conducted into the channel region 78 of the N-well extending from the region 76 of the transistor 60t. The channel region 78 is immediately charged with or discharged of the positive carriers (holes) when the transistor 60t is biased into a conductive state by a signal applied on the gate conductor 70. The transistor 60t is biased into a nonconductive state after the channel region 78 has been charged or discharged. The channel region 78 tends to retain the charged carriers after the transistor becomes nonconductive. However, junction leakage current and channel leakage current create a small but significant current which tends to alter the charge stored in the channel region 78. Because of these currents in a typical DRAM, the memory cell capacitors must be continually refreshed on a repetitive basis, typically at approximately 1–2 millisecond intervals. Refreshing the cell involves reading it and then writing back the signals read from the memory cell. The write-back operation replenishes the charge dissipated by the leakage current since the last refresh operation and by the read operation.

The bit lines 64t and 64c are next formed on the upper surface of the insulating layer 80, as shown in FIGS. 6 and 7. The bit lines 64t and 64c are preferably formed of metal, in a first metal layer located above the insulation layer 80 on top of the polysilicon layer used to form of conductors 63 and 70. The bit lines 64t and 64c extend generally parallel to the longer dimension of the rectangular transistor-capacitor combinations 58t and 58c as shown in FIGS. 5 and 6. The bit lines 64t and 64c are connected to the drain regions 72 of the transistor 60t and 60c by an extension post 82 of the bit line material down into contact with the drain region 72.

The N-well 68 is connected at a plurality of spaced-apart intervals to positive voltage conductors 84. To apply the positive voltage from the quiet positive power supply 30 (FIG. 1) to the N-well 68, a N+ region 86 is formed into the N-well 68, as shown in FIG. 7. The N+ region 86 is preferably formed in a similar manner to, and while, the N+ regions of the other transistors (not shown) which are complementary to the P-channel transistors 60t and 60c are formed in the SLIC. As shown in FIG. 2, the conductors 84 extend vertically in the matrix 56 parallel to the columns of memory cells. Preferably, one conductor 84 extends vertically on each transversly opposite side of each bit block 55. In other words, a vertical conductor 84 exists on each lateral side of each bit block 55.

As shown in FIG. 7, after the insulating layer 80 is laid down, the vertically extending positive voltage conductor 84 is formed on top of the insulating layer 80. The vertically extending voltage conductor 84 is located in the first metal layer of the DRAM segment, along with the bit lines 64t and 64c. An extension post 88 from the conductor 84 extends through a hole in the insulating layer 80 and makes contact with the N+ region 86.

A layer 90 of insulating material is next laid down, and a horizontally extending voltage conductor 92 is formed on top of the insulating layer 90. The horizontal power conductor 92 is located in a second metal layer of the DRAM segment 50. An extension post 94 from the conductor 92 extends downward through a hole formed in the insulating layer 90 into contact with the conductor 84, thereby connecting both conductors 84 and 92.

The vertically oriented positive voltage conductors 84 intersect with and connect to the horizontally extending positive voltage conductors 92 at spaced apart intervals established by the locations of the extension posts 94 throughout the matrix of memory cells. Specifically, it is preferred that one horizontal conductor 92 extend between each vertically adjacent two rows of memory cells. In other words, one horizontal conductor exists for each pair of horizontal rows of memory cells.

Spaced in this manner, the intersecting conductors 84 and 92 form a mesh 96 of perpendicularly intersecting positive voltage conductors extending throughout the DRAM segment 50. The mesh 96 is connected to the N-well 68 at numerous intervals established by the locations of the extension posts 86 (FIGS. 5 and 7). The quiet positive power supply 30 (FIG. 1) is connected to the mesh 96. Because of the mesh 96 of distributed, multiple positive voltage conductors 84 and 92 connected at numerous periodic intervals by the extension posts 88 to a single large N-well 68 or to multiple smaller N-wells 68 (which contain less than all of the memory cells of the DRAM segsment), the N-well voltage is held at a stable level. Localized influences from noise are avoided, because of the numerous conduction paths and reduced inductance of the multiple connected conductors 84 and 92. The reduced inductance of the mesh 96 presents a reduced impedance to the rapidly changing and transit currents which are typically conducted by the components of the SLIC, including the substrate. The reduced impedance of the mesh 96 thereby prevents the current transients from inducing significant voltages on the memory cells and bit lines. As a result, the signals from the memory cells and bit lines are more accurately read and preserved in an non-corruptible state.

Figure 8:
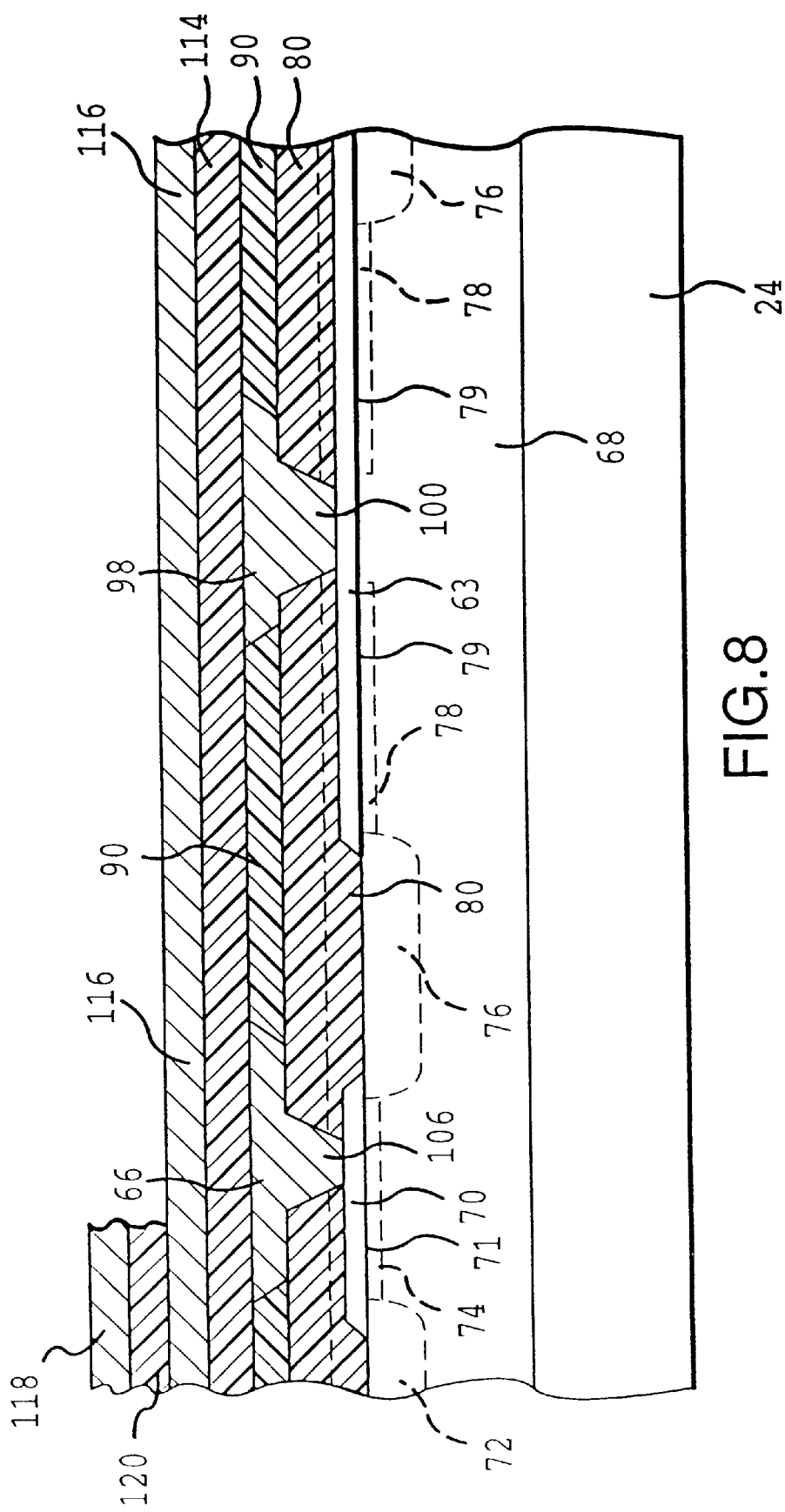
FIG. 8 is an enlarged cross sectional view taken substantially in the plane of line 8—8 in FIG. 5.

As shown in FIGS. 2, 5 and 8, a metal reference conductor 98 extends parallel to each polysilicon capacitor reference potential conductor 63. The metal reference conductor 98 extends in the second metal layer of the DRAM segment 50. The reference conductor 98 is connected by extension posts 100 located at each end of the capacitor reference potential conductor 63 which spans the rows of each bit block 55 (FIG. 2). The extension posts 100 extend through holes formed in the insulating layers 80 of the DRAM segment. In addition, as shown in FIGS. 2 and 5, a plurality of metal conductors 102 connect to and intersect perpendicularly with the conductors 98 to form a second mesh 104. The conductors 98 and 102 are conducted by a plurality of extension posts 103, in the same manner as other conductors have been connected, as previously described. The conductors 102 extend parallel to and are laterally displaced to the side of the conductors 84, as shown in FIG. 2. Thus, the conductors 102 extend on opposite sides of each bit block 55. The conductors 98 extend directly above the capacitor reference potential conductors 63, and thus, one conductor 98 exists for each two rows of memory cells. The conductors 102 are thus located in the first metal layer, and the conductors 98 are located in the second metal layer. The mesh 104 and its conductors 98 and 102 are connected to the quiet negative voltage power supply 36 (FIG. 1). The mesh 104 overlays the DRAM cells 54 of the matrix 56, as shown in FIG. 2.

Like the mesh 96 connected to the N-well 68, the reduced inductance of the multiple, distributed and interconnected conductors 98 and 102 prevents current transients from inducing localized and widespread voltage variations in the reference potential plates of the memory capacitors. The mesh 104 thus maintains a uniform reference potential voltage for the memory cell capacitors. The more uniform reference voltage allows the memory cells to be charged more evenly and accurately, resulting in more precise voltage levels to be developed. Without the uniform reference potential voltage provided by the mesh 104, some of the memory cell capacitors might exhibit more charge accumulation than others under the same charging conditions, particularly when subjected to the variable and unpredictable influences of noise. As a consequence, the noise influences will not have the effect of varying the voltage from the memory cell capacitors, as might otherwise occur if the capacitor reference potential conductors 63 were not so completely and uniformly connected to the quiet reference potential 34 (FIG. 1) by the mesh 104. As a result, the signals stored in the memory cell capacitors more accurately represent the data intended, and are more accurately read on the bit lines.

The polysilicon gate conductors 70 are also connected to metal word line conductors 66 located in the second metal layer of the DRAM segment 50, as shown in FIGS. 5 and 8. Each metal word line 66 is connected by an extension post 106 which extends through holes formed in the insulating layer 80 to contact the polysilicon gate conductor 70, as shown in FIG. 8. The extension posts 106 connect to the polysilicon gate conductors 70 at the beginning of each row of memory cells in a bit block. The metal word line conductor 66 and the periodic connections at the extension posts 106 have the effect of reducing the amount of resistance which would otherwise be present if the polysilicon gate conductors 70 extended completely across the DRAM segment. By eliminating a substantial amount of the resistance from the polysilicon gate conductors 70 by using the metal word line conductors 66, the propagation time of the word line signals is reduced to speed the operational capabilities of the DRAM.

Next, to complete the construction of the DRAM segment, as shown in FIGS. 6 and 7, another layer 98 of insulating material is laid down on top of the conductors 92 and on top of the insulating layer 90. Thereafter, shielding conductor formed by an integral layer of metal 116 is placed on top of the insulating layer 98. The integral metal layer 116 is connected to the quiet negative voltage power supply 36 (FIG. 1). Additional layers 18 of metal conductors which are separated by insulating layers 120 may be fabricated on top of the metal layer 116. For example, address bus and power supply conductors may be placed in these layers above the metal layer 116. The integral metal layer 116 shields the underlying DRAM components from the effects of noise induced by the voltage transients conducted by the overlaying conductors above the metal layer 116. Connected to the quiet negative voltage power supply 34 (FIG. 1), the metal layer 116 thus acts as a shield to externally induced noise in the DRAM segment 50.

The improvement of forming the memory cells 54 in the N-well 68 reduces the impact of noise on the memory cells 54 because each memory cell 54 is essentially isolated from the substrate 24 through the N-well 68. When the voltage on the substrate 24 fluctuates or bounces, the mesh 96 reduces the impact of any externally induced voltages on the N-well 68. The quiet positive voltage power supply 30 (FIG. 1), to which the mesh 96 is electrically connected, is essentially dedicated to conduct voltage to the N-well 68 but to no other devices, either on the SLIC (FIG. 1) or on the printed circuit board (not shown) to which the SLIC is connected. Since no other devices are connected to the quiet positive voltage power supply 30, no stray transient currents are induced in the N-well 68. Furthermore, if transient currents are present in the N-well, the low inductance of the mesh 96 prevents voltages from being induced into the N-well 68, the memory cells 54 and/or the bit lines 64. Therefore the sensed signals on the bit lines 64t and 64c are more accurate.

The N-well 68 further provides the benefit of reducing the possibility of errors induced in the memory cells 54 by alpha particles or other radioactive species. The substrate 24 is connected to the negative voltage power supply 34 (FIG. 1) and the N-well 68 is connected to the positive voltage power supply 30 (FIG. 1). Since the P-type substrate 24 has a majority of positive charge carriers (holes), and since the N-well 68 has an abundance of negative charge carriers (electrons), the positively and negatively charged carriers created by the alpha particles will substantially be eliminated before they influence the capacitor charge. The excess positively charged carriers (holes) will be conducted by the P-type substrate to the negative voltage power supply 34 (FIG. 1), thus leaving only the negatively charged carriers (electrons) to migrate from the substrate into the N-well. However the N-well is connected to the quiet positive voltage power supply 30 (FIG. 1), and thus the electrons which enter the N-well will be conducted to that power supply 30. Only a small number of the holes created by the alpha particles in the N-well may escape collection and dissipation in this manner, thus substantially reducing the negative impact of alpha particles on the DRAM.

The DRAM segment 50 is also less susceptible to spurious noise because each cell 50 uses two capacitors 62t and 62c for storing charges that represent a single bit of data. Comparing the two voltages produced by the charges on the two capacitors 62t and 62c yields a more reliable determination of the data level of the cell than comparing the voltage on a single capacitor to a reference voltage level. Using two memory capacitors 62t and 62c to store charges representing one data bit reduces the impact of noise on the DRAM segment 50 because the two capacitors 62t and 62c are placed relatively close together on the chip 22 and the noise that affects one capacitor typically affects the other capacitor to the same degree, but will not disturb the relative difference in voltage between the two capacitors. Most noise will substantially equally affect both capacitors 62t and 62c to maintain the difference in stored charges between the two capacitors 62t and 62c.

Additionally, the bit lines 64t and 64c that conduct the voltage signals for the complementary memory capacitors 62t and 62c are also close to each other, preferably no more than a micron apart. The induced voltages occurring on one bit line 64t will therefore be similar and approximately equal to those induced on the other bit line 64c. The difference between the two bit line voltages is thus maintained in the presence of noise. Consequently, the voltages sensed by the sense amplifiers 67 (FIG. 4) produce correct signals for reliable sensing and detection. Although the construction of the memory cells has been described in connection with the structure of the DRAM segment 50, the first, second and third metal layers of the DRAM segment will usually continue over into the other components of the SLIC 20.

The improvements available from the present invention are accomplished by fabricating the embedded DRAM using standard logic fabrication processes. A more complex hybrid fabrication process combining both logic and DRAM techniques is not required to form the SLIC, or to obtain the significant DRAM improvements in the context of a DRAM embedded in a SLIC.

A presently preferred embodiment of the present invention has been described with a degree of particularity. This description is of a preferred example of implementing the invention, and is not necessarily intended to limit the scope of the invention. The scope of the invention is defined by the following claims.

The invention claimed is:

1. A dynamic random access memory (DRAM) segment formed by a plurality of memory cells embedded as a matrix within a system level integrated circuit (SLIC) having a plurality of functional components in addition to the DRAM segment, wherein:

the memory cells are formed in a well of one majority carrier types;

the well is formed in a substrate of the other majority carrier types;

the DRAM segment has a well conductor connected to the well for connecting the well to a quiet sower supply which is external to the SLIC and substantially isolated and separate from an operational Power supply for the SLIC;

the well electrically isolates each memory cell from electrical signals conducted in the substrate; and the electrical signals in the substrate are induced by current conducted by the substrate and caused by current switching operations of the functional components of the SLIC.

2. A DRAM segment as defined in claim 1 wherein the well conductor is connected to the well at a plurality of spaced-apart locations throughout the well to create a uniform potential from the external quiet power supply throughout the well.

3. A DRAM segment as defined in claim 2 wherein the well conductor is a mesh of intersecting connected conductors.

4. A DRAM segment as defined in claim 1 further comprising, in combination, a quiet, substantially isolated, first power supply connected to the well conductor and a second power supply connected to the substrate, the polarity of the first and second power supplies being respectfully opposite of one another, and the first and second Power supplies being separate and external to the SLIC.

5. A DRAM segment as defined in claim 4 wherein:

each memory cell includes a memory cell capacitor having a reference potential plate; and further comprising:

a capacitor reference potential conductor connected to all of the reference potential plates of all the memory cell capacitors to distribute potential substantially uniformly to all of the reference potential plates.

6. A DRAM segment as defined in claim 5 further comprising, in combination, a quiet, substantially isolated third power supply of substantially the same polarity as the second power supply which is connected to the capacitor reference potential conductor and which is external to the SLIC.

7. A DRAM segment as defined in claim 1 further comprising:

a plurality of well connections to the well located at periodically spaced-apart locations throughout the well and between the memory cells in the matrix; and wherein the well conductor includes a plurality of conductors connected to the well connections and extending across the matrix.

8. A DRAM segment as defined in claim 7 wherein the Plurality of conductors intersect with and connect to one another to form a mesh which overlays the matrix of memory cells.

9. A DRAM segment as defined in claim 1 wherein each memory cell includes a pair of capacitors which store complementary charges indicative of a data bit, and the memory cell supplies an output signal related to a differential of the charge stored on both capacitors.

10. A DRAM segment as defined in claim 1 wherein the well is of N-type material, the substrate is P-type material, and the memory cells comprise P-channel transistors.

11. A DRAM segment as defined in claim 1 wherein the memory cells of the segment are formed in a single well.

12. A DRAM segment as defined in claim 1 wherein a plurality of groups of the memory cells of the segment are each formed in a separate well.

13. A DRAM segment as defined in claim 1, wherein each memory cell includes a capacitor and a transistor connected to conduct charge to and conduct charge from the memory cell capacitor, and the memory cell capacitor includes an oxide dielectric material which is formed between plates of the capacitor and simultaneously with a gate oxide of the transistor.

14. A dram segment as defined in claim 8 wherein:

the plurality of conductors connect to the well connections at periodic locations relative to the intersections of the plurality of conductors.

15. A dynamic random access memory (DRAM) segment formed in an integrated circuit (IC) chip by a plurality of memory cells formed in a well of one majority carrier type with the well formed in a substrate of the other majority carrier type, the well electrically isolating each memory cell from electrical signals conducted in the substrate, the memory cells formed in a matrix, and further comprising:

an integrally continuous layer of metal which is spaced from and overlays the memory cells in the matrix; and means for connecting the integral continuous layer of metal to a quiet power supply external to the IC chip to shield the memory cells of the matrix from electrical noise.

16. A dynamic random access memory (DRAM) segment formed in an integrated circuit (IC) chip by a plurality of memory cells formed in a well of one majority carrier type with the well formed in a substrate of the other majority carrier type, the well electrically isolating each memory cell from electrical signals conducted in the substrate, the memory cells formed in a matrix, and further comprising:

- an integrally continuous layer of metal which is spaced from and overlays the memory cells in the matrix;
- at least one additional layer of electrical conductors spaced from the integral continuous metal layer on an opposite side of the metal layer from of the memory cells, the additional layer of electrical conductors conducting electrical signals; and
- means for connecting the integral continuous layer of metal to a quiet power supply external to the IC chip to shield the memory cells of the matrix from electrical noise created by the conduction of electrical signals through the additional layer of electrical conductors.

17. A DRAM segment as defined in claim 16 wherein the memory cells are embedded in a system level integrated circuit (SLIC) having a plurality of functional components in addition to the DRAM segment, and wherein the electrical conductors of the additional layer conduct signals between the DRAM segment and the functional components of the SLIC.

18. A DRAM segment as defined in claim 16 wherein the electrical conductors of the additional layer are part of a bus which conducts electrical signals to and from the DRAM segment.

19. A DRAM segment as defined in claim 16 wherein the electrical conductors of the additional layer are part of power conductors which supply electrical power to the DRAM segment.

20. A dynamic random access memory (DRAM) segment formed by a plurality of memory cells formed in a well of one majority carrier type with the well formed in a substrate of the other majority carrier type, the well electrically isolating each memory cell from electrical signals conducted in the substrate, wherein:

- each memory cell includes a pair of capacitors which store complementary charges indicative of a data bit, and the memory cell supplies an output signal related to a differential of the charge stored on both capacitors.

21. A dynamic random access memory (DRAM) segment formed by a plurality of memory cells formed in a well of one majority carrier type with the well formed in a substrate of the other majority carrier type, the well electrically isolating each memory cell from electrical signals conducted in the substrate, wherein:

- each memory cell includes a capacitor and a transistor connected to conduct charge to and conduct charge from the memory cell capacitor, and the memory cell capacitor includes an oxide dielectric material which is formed between plates of the capacitor and simultaneously with a gate oxide of the transistor.

* * * * *